US008290115B2

(12) United States Patent
Kim et al.

(10) Patent No.: US 8,290,115 B2

(45) Date of Patent: Oct. 16, 2012

(54) DRIVER AND ORGANIC LIGHT EMITTING DIODE DISPLAY USING THE SAME

(75) Inventors: Dong-Hwi Kim, Yongin (KR); Hwan-Soo Jang, Yongin (KR); Seon-I Jeong, Yongin (KR); Ki-Myeong Eom, Yongin (KR)

(73) Assignee: Samsung Display Co., Ltd., Suwon-si, Gyeonggi-do (KR)

( * ) Notice: Subject to any disclaimer, the term of this patent is extended or adjusted under 35 U.S.C. 154(b) by 316 days.

(21) Appl. No.: 12/801,351

(22) Filed: Jun. 4, 2010

(65) Prior Publication Data

US 2011/0080393 A1 Apr. 7, 2011

(30) Foreign Application Priority Data

Oct. 7, 2009 (KR) ........................ 10-2009-0095024

(51) Int. Cl.
*G11C 19/00* (2006.01)

(52) U.S. Cl. ............................. 377/68; 377/64; 345/204

(58) Field of Classification Search ............... 377/64–81
See application file for complete search history.

(56) References Cited

U.S. PATENT DOCUMENTS 5,367,551 A * 11/1994 Okumura et al. ............... 377/80
2007/0195920 A1* 8/2007 Tobita ............................. 377/64
2008/0062097 A1* 3/2008 Jeong et al. ..................... 345/84

FOREIGN PATENT DOCUMENTS

KR 10 2006-0073680 A 6/2006
KR 10 2006-0087187 A 8/2006
KR 10 2007-0049906 A 5/2007
KR 10 0759672 B1 9/2007
KR 10-2008-0022695 A 3/2008
KR 10-2008-0114365 A 12/2008

OTHER PUBLICATIONS

Korean Office Action in KR 10-2009-0095024, dated Jul. 29, 2011 (Kim, et al.).

* cited by examiner

*Primary Examiner* — Alexander Eisen
*Assistant Examiner* — Mark Regn
(74) *Attorney, Agent, or Firm* — Lee & Morse, P.C.

(57) ABSTRACT

A driver comprises odd-numbered stages configured to be driven by first and second clock signals and even-numbered stages configured to be driven by the second and third clock signals. Each stage is coupled to a corresponding emission control line, and includes a first driver, a second driver, and a third driver. In a first stage, the first and second drivers receive first and second start pulses and output first and second output signals, respectively. In each stage except the first stage, the first and second driver receives first and second output signals of a previous stage and outputs first and second output signals of each stage, respectively. In each stage, a third driver receives the first and second output signals of each stage and outputs an emission control signal to be transmitted to an emission control line coupled to each stage.

19 Claims, 7 Drawing Sheets

DRIVER AND ORGANIC LIGHT EMITTING DIODE DISPLAY USING THE SAME

BACKGROUND

1. Field

Embodiments relate to a driver and an organic light emitting diode (OLED) display using the same, and more particularly, to a driver capable of freely controlling widths of signals and improving reliability and an OLED display using the same.

2. Description of the Related Art

Weight and volume are disadvantages of cathode ray tubes (CRT). However, recently, various flat panel displays (FPD) capable of reducing their weight and volume have been developed. The FPDs include a liquid crystal display (LCD), a field emission display (FED), a plasma display panel (PDP), and an OLED display.

Among the FPDs, an OLED display displays images using OLEDs that generate light by re-combination of electrons and holes. An OLED display has a high response speed, and is driven with low power consumption. The conventional OLED displays supply currents corresponding to data signals to OLEDs using the transistors formed in pixels so that light is generated by the OLEDs.

The conventional OLED displays include a data driver configured to supply data signals to data lines, a scan driver configured to sequentially supply scan signals to scan lines, an emission control line driver configured to supply emission control signals to emission control lines, and a pixel unit including a plurality of pixels coupled to the data lines, the scan lines, and the emission control lines.

The pixels included in the pixel unit are selected when the scan signals are supplied to the scan lines to receive the data signals from the data lines. The pixels that received the data signals generate light having predetermined brightness corresponding to the data signals, and display a predetermined image. The emission time of pixels is controlled by the emission control signals supplied from the emission control lines. In general, the emission control signals are supplied so as to overlap the scan signals supplied to one scan line or two scan lines. Pixels to which the data signals are supplied are set in a non-emission state by the emission control signals.

Currently, optimal setting of brightness of a panel to correspond to an amount of external light is actively researched. Brightness of a panel may be controlled by various methods. For example, brightness of a panel may be controlled by controlling a bit of data to correspond to the amount of the external light. However, complicated processes have to be performed to control the bit of the data.

In order to solve such a problem, a method of controlling a width of the emission control signals is suggested to control the brightness of the panel. Timing of turning on a pixel is controlled to correspond to the width of the emission control signals to control the brightness of a panel. Therefore, an emission control line driver capable of freely controlling the width of the emission control signals is required.

SUMMARY

Embodiments are therefore directed to a driver capable of freely controlling widths of signals and improving reliability and an organic light emitting display using the same, which substantially overcome one or more of the problems due to the limitations and disadvantages of the related art.

It is therefore a feature of an embodiment to provide a driver comprising: odd-numbered stages configured to be driven by a first clock signal and a second clock signal; and even-numbered stages configured to be driven by the second clock signal and a third clock signal, wherein each of the odd-numbered and even-numbered stages includes a first driver, a second driver, and a third driver, and is coupled to a corresponding emission control line, wherein the first driver of a first stage is configured to receive a first start pulse and output a first output signal of the first stage, the second driver of the first stage is configured to receive a second start pulse and output a second output signal of the second stage, and the third driver of the first stage is configured to receive the first output signal of the first stage and the second output signal of the second stage, and output an emission control signal to be transmitted to an emission control line coupled to the first stage, and wherein the first driver of each stage except the first stage is configured to receive a first output signal of a previous stage and output a first output signal of each stage, the second driver of each stage except the first stage is configured to receive a second output signal of the previous stage and output a second output signal of each stage, and the third driver of each stage except the first stage is configured to receive the first output signal and the second output signal and output an emission control signal to be transmitted to a emission control line coupled to each stage.

The first clock signal, the second clock signal, and the third clock signal may be sequentially supplied in order thereof.

The first clock signal, the second clock signal, and the third clock signal may be supplied in the same period.

A width of the emission control signals may be determined by a period between the first start pulse and the second start pulse.

Each of the first output signals may be supplied at a point of time in synchronization with the first clock signal, and the second clock signal may be supplied after the point of time in synchronization with the first clock signal.

Each of the first driver and the second driver may comprise a twelfth transistor having a second gate electrode coupled to a first input terminal, a third electrode coupled to a first power source, and a fourth electrode coupled to an eleventh node, the twelfth transistor controlling a voltage of the eleventh node so as to correspond to a voltage applied to the first input terminal, an eleventh transistor having a first gate electrode coupled to the first input terminal, a first electrode coupled to a second power source, and a second electrode coupled to a twelfth node, the eleventh transistor controlling a voltage of the twelfth node so as to correspond to the voltage applied to the first input terminal, a thirteenth transistor coupled between the first power source and the twelfth node and controlled by the voltage of the eleventh node, a fourteenth transistor coupled between the eleventh node and the second power source and controlled by a voltage of a second input terminal, a fifteenth transistor coupled between the first power source and an output terminal and controlled by the voltage of the eleventh node, a sixteenth transistor coupled between the output terminal and a third input terminal and controlled by the voltage of the twelfth node, an eleventh capacitor coupled between a gate electrode of the fifteenth transistor and the first power source, and a twelfth capacitor coupled between a gate electrode of the sixteenth transistor and the output terminal.

The first power source may be set to have a higher voltage than the second power source.

The first start pulse may be supplied to the first input terminal of the first driver in the first stage, and the first output signal of the previous stage may be supplied to the first input terminal of the first driver in the each stage except the first stage. The second start pulse may be supplied to the first input terminal of the second driver in the first stage, and a second output signal of a previous stage may be supplied to the first input terminal of the second driver in each stage except the first stage.

The second clock signal may be supplied to the second input terminals of the first driver and the second driver included in each of the odd-numbered stages, and the first clock signal may be supplied to the third input terminals of the first driver and the second driver included in each of the odd-numbered stages.

The third clock signal may be supplied to the second input terminal of the first driver and the second driver included in each of the even-numbered stages, and the second clock signal may be supplied to the third input terminal of the first driver and the second driver included in each of the even-numbered stages.

The first driver may output the first output signal to the output terminal of the first driver, and the second driver may output the second output signal to the output terminal of the second driver.

The third driver may output the emission control signal from a first point of time when the first output signal has a low voltage to a second point of time when the second output signal has a low voltage.

The third driver may comprise a fifth transistor having a third gate electrode coupled to a fourth input terminal and a fifth electrode coupled to the first power source, the fifth transistor controlling a voltage of a second node so as to correspond to a voltage applied to the fourth input terminal, a fourth transistor having a fourth gate electrode coupled to the fourth input terminal and a sixth electrode coupled to the second power source, the fourth transistor controlling a voltage of a first node so as to correspond to the voltage applied to the fourth input terminal, a sixth transistor coupled between the second node and the second power source and controlled by a voltage of a fifth input terminal, a first transistor coupled between the first power source and an output terminal and controlled by the voltage of the first node, a second transistor coupled between the output terminal and the second power source and controlled by the voltage of the second node, a third transistor coupled between the first power source and the first node and controlled by the voltage of the second node, a first capacitor coupled between a gate electrode of the second transistor and the output terminal, and a second capacitor coupled between a gate electrode of the first transistor and the first power source.

The fourth input terminal may receive the first output signal, and the fifth input terminal may receive the second output signal.

The output terminal may be coupled to a corresponding emission control line.

The fifth transistor may be substituted by two or more transistors coupled in series.

It is therefore another feature of an embodiment to provide an organic light emitting diode display, comprising: a scan driver configured to sequentially supply scan signals to scan lines; a data driver configured to supply data signals to data lines in synchronization with the scan signals; pixels positioned at intersections of the scan lines and the data lines; and the driver as described above, the driver configured to transmit the emission control signals to emission control lines running in parallel with the scan lines.

It is therefore another feature of an embodiment to provide a driver, comprising stages coupled to signal lines, wherein each of the stages comprises: a twelfth transistor having a second gate electrode coupled to a first input terminal, a third electrode coupled to a first power source, and a fourth electrode coupled to an eleventh node, the twelfth transistor controlling a voltage of the eleventh node so as to correspond to a voltage applied to the first input terminal; an eleventh transistor having a first gate electrode coupled to the first input terminal, a first electrode coupled to a second power source, and a second electrode coupled to a twelfth node, the eleventh transistor controlling a voltage of the twelfth node coupled to correspond to the voltage applied to the first input terminal; a thirteenth transistor coupled between the first power source and the twelfth node and controlled by a voltage of the eleventh node; a fourteenth transistor coupled between the eleventh node and the second power source and controlled by a voltage of a second input terminal; a fifteenth transistor coupled between the first power source and an output terminal and controlled by the voltage of the eleventh node; a sixteenth transistor coupled between the output terminal and a third input terminal and controlled by the voltage of the twelfth node; an eleventh capacitor coupled between a gate electrode of the fifteenth transistor and the first power source; and a twelfth capacitor coupled between a gate electrode of the sixteenth transistor and the output terminal.

The first power source may be set to have a higher voltage than the second power source.

It is therefore another feature of an embodiment to provide an organic light emitting diode display, comprising: a scan driver configured to sequentially supply scan signals to scan lines; a data driver configured to supply data signals to data lines in synchronization with the scan signals; pixels positioned at intersections of the scan lines and the data lines; and the driver described above, the driver configured to transmit the emission control signals to emission control lines running in parallel with the scan lines.

It is therefore another feature of an embodiment to provide an organic light emitting display, comprising: the driver as described above, the driver sequentially supplying scan signals to scan lines; a data driver configured to supply data signals to data lines in synchronization with the scan signals; pixels positioned at intersections of the scan lines and the data lines; and an emission control line driver configured to supply emission control signals to emission control lines running in parallel with the scan lines.

In the driver according to the embodiments and the OLED display using the same, the supply points of time of the first start signal and the second start signals may be controlled so that the width of the emission control signals may be freely controlled. The stages included in the driver according to the embodiments may be driven by two pulses from the outside. Since the transistors included in the driver according to the embodiments has the same conduction type (for example, a PMOS type), the transistors may be mounted on the panel.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
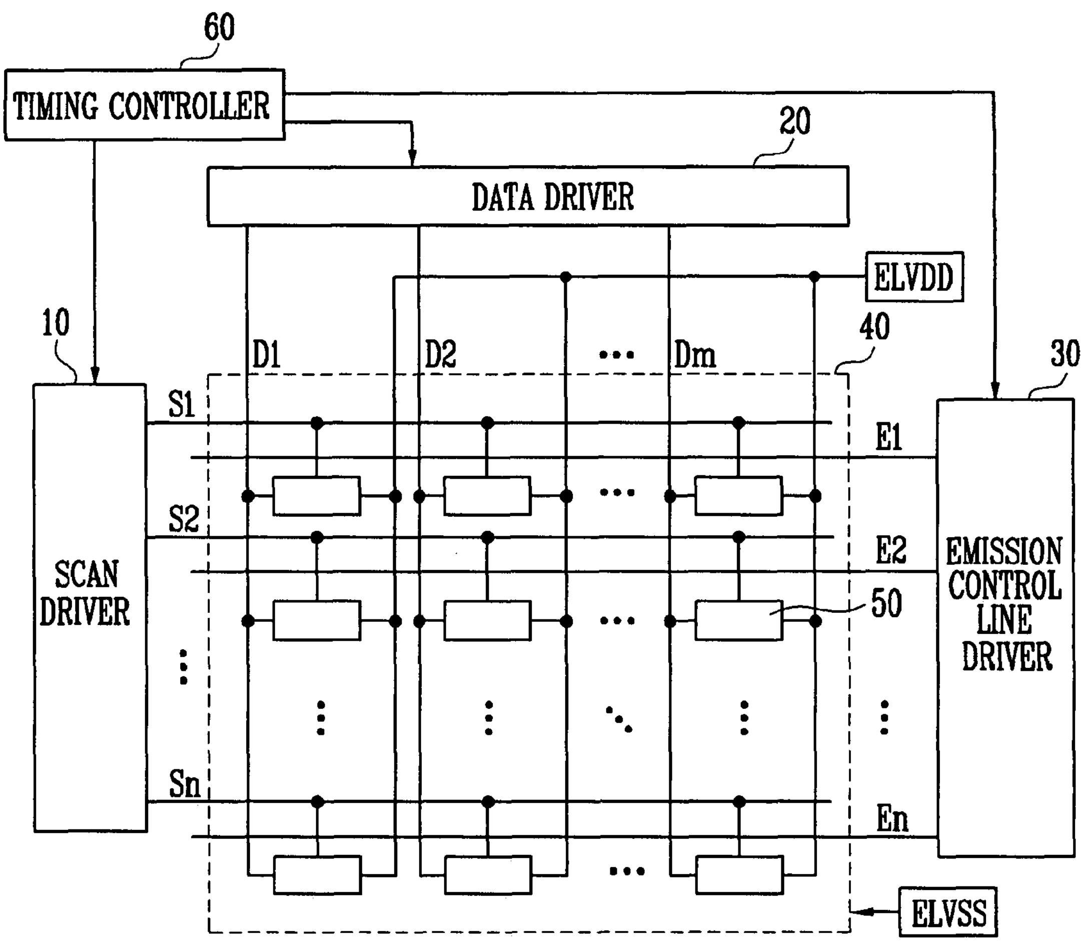
FIG. 1 illustrates a schematic diagram of an OLED display according to an embodiment.

Korean Patent Application No. 10-2009-0095024, filed on Oct. 7, 2009, in the Korean Intellectual Property Office, and entitled: "Driver and Organic Light Emitting Diode Display Device Using the same" is incorporated by reference herein in its entirety.

Exemplary embodiments will now be described more fully hereinafter with reference to the accompanying drawings; however, they may be embodied in different forms and should not be construed as limited to the embodiments set forth herein.

Also, when an element is referred to as being "coupled to" other element, it can be directly connected to the other element or be indirectly connected to or coupled to the other element with one or more intervening elements interposed therebetween. Hereinafter, like reference numerals refer to like elements.

FIG. 1 illustrates a schematic diagram of an OLED display according to an embodiment. In FIG. 1, a scan driver 10 and an emission control line driver 30 are separated from each other. However, the emission control line driver 30 may be included in the scan driver 10.

Referring to FIG. 1, the OLED display may include a pixel unit 40 including a plurality of pixels 50 coupled to scan lines S1 to Sn, data lines D1 to Dm, and emission control lines E1 to En, the scan driver 10 configured to drive the scan lines S1 to Sn, a data driver 20 configured to drive data lines D1 to Dm, the emission control line driver 30 configured to drive the emission control lines E1 to En, and a timing controller 60 configured to control the scan driver 10, the data driver 20, and the emission control line driver 30.

The scan driver 10 may be controlled by the timing controller 60, and sequentially supply scan signals to the scan lines S1 to Sn. Then, the pixels 50 coupled to the scan lines S1 to Sn may be sequentially selected.

The data driver 20 may be controlled by the timing controller 60, and supply data signals to the data lines D1 to Dm. The data driver 20 may supply the data signals to the data lines D1 to Dm whenever the scan signals are supplied. Then, the data signals may be supplied to pixels selected by the scan signals among the pixels 50 and the selected pixels may charge the voltages corresponding to the data signals supplied to the selected pixels.

The emission control line driver 30 may be controlled by the timing controller 60 and sequentially supply emission control signals to the emission control lines E1 to En. The emission control line driver 30 may supply the emission control signals so that the pixels 50 do not emit light for a period of supplying the data signals to the pixels 50.

Here, the width of the emission control signals may be controlled by the driving signals supplied from the timing controller 60.

Figure 2:
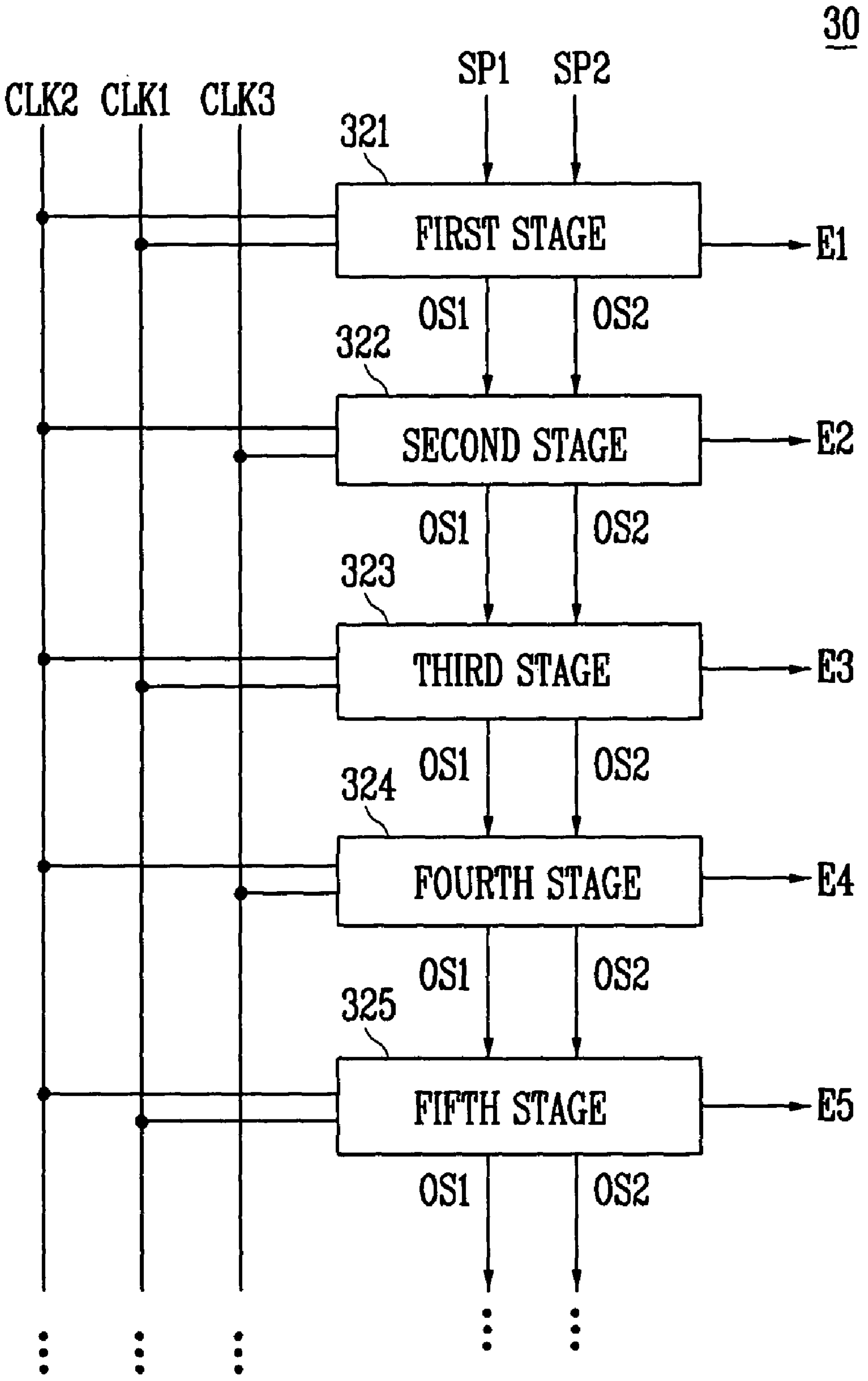
FIG. 2 illustrates a schematic diagram of stages of the emission control line driver illustrated in FIG. 1.

FIG. 2 illustrates a schematic diagram of stages of the emission control line driver illustrated in FIG. 1. The emission control line driver 30 may include n stages configured to supply the emission control signals to n emission control lines E1 to En. However, in FIG. 2, five stages 321 to 325 are illustrated for the convenience sake.

Referring to FIG. 2, the emission control line driver 30 includes five stages 321, 322, 323, 324, and 325 configured to supply the emission control signals to the emission control lines E1 to E5, respectively. The stages 321 to 325 may be coupled to the emission control lines E1 to E5 and driven by two clock signals.

In detail, the timing controller 60 may supply first, second, and third clock signals CLK1, CLK2, and CLK3, a first start signal SP1, and a second start signal SP2 to the emission control line driver 30. Here, the second clock signal CLK2 may be supplied to the stages 321 to 325. The first clock signal CLK1 may be supplied to the odd stages 321, 323, and 325. The third clock signal CLK3 may be supplied to the even stages 322 and 324. Here, the first to third clock signals CLK1 to CLK3 may be set in the same period. The first start signal SP1 and the second start signal SP2 may be supplied no less than once in a frame period.

The first stage 321 may receive the first and second start signals SP1 and SP2. The first stage 321 that received the first and second start signals SP1 and SP2 may output an emission control signal E1. Here, a width of the emission control signal E1 may be determined so as to correspond to an interval between the first start signal SP1 and the second start signal SP2 (that is, a period since the first start signal SP1 is applied until the second start signal SP2 is applied). For example, when the period between the first start signal SP1 and the second star signal SP2 is set to be large, the width of the emission control signal E1 may be set to be large. When the period between the first start signal SP1 and the second start signal SP2 is set to be small, the width of the emission control signal E1 may be set to be small.

The first stage 321 may supply a first output signal OS1 and a second output signal OS2 to the second stage 322. Here, an interval between the first output signal OS1 and the second output signal OS2 may be determined so as to correspond to the period between the first start signal SP1 and the second start signal SP2. For example, the period between the first output signal OS1 and the second output signal 0S2 may be set to be equal to the period between the first start signal SP1 and the second start signal SP2. The first output signal OS1 and the second output signal 0S2 may respectively perform the same functions as the first and second start signals SP1 and SP2 supplied to the first stage 321. As such, an ith (i is a natural number) stage 32*i* may supply the first output signal OS1 and the second output signal 0S2 to (i+1)th stage 32*i*+1.

Figure 3:
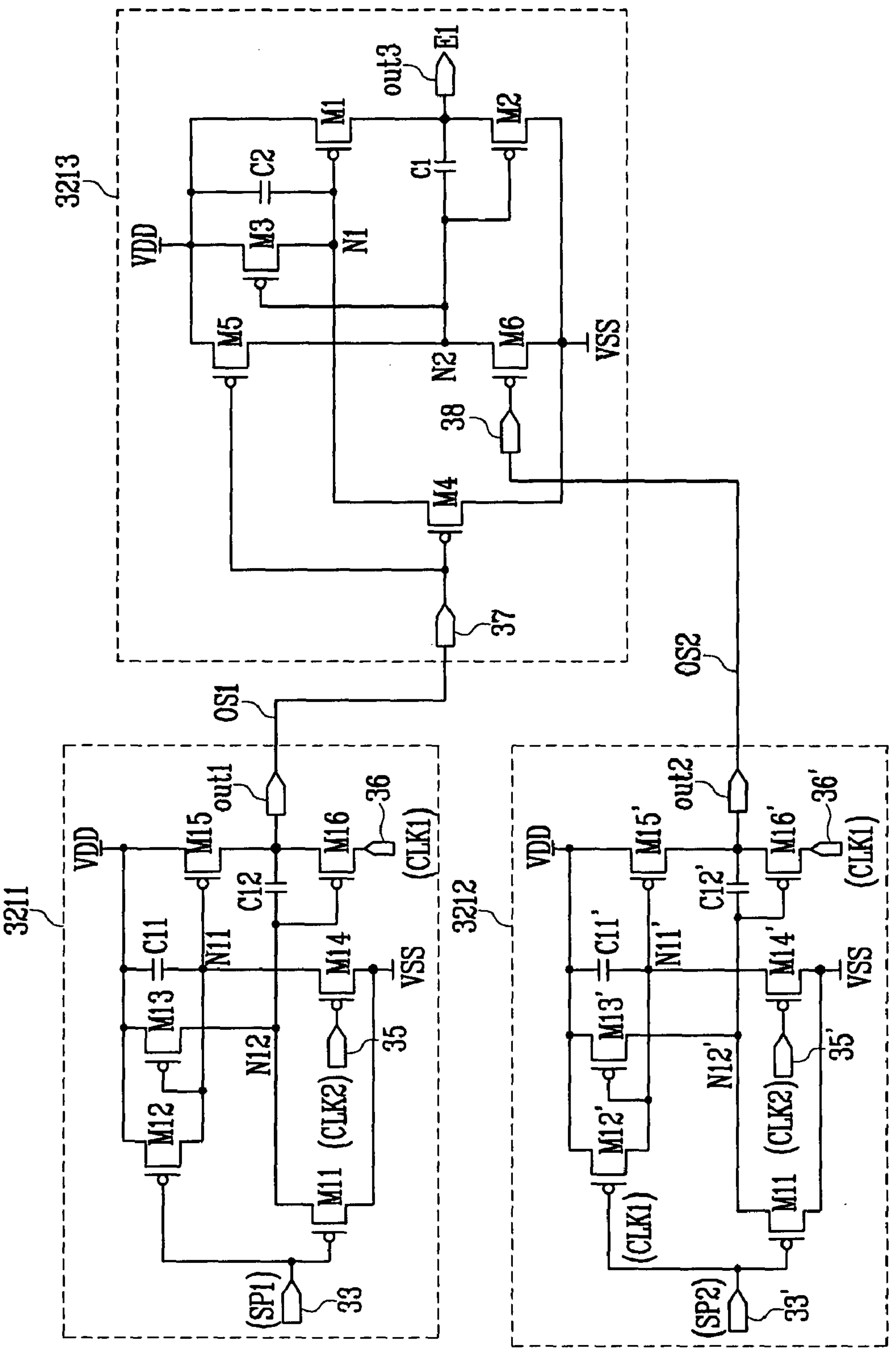
FIG. 3 illustrates a schematic circuit diagram of the first stage illustrated in FIG. 2.

FIG. 3 illustrates a schematic circuit diagram of a stage illustrated in FIG. 2. In FIG. 3, for convenience sake, the first stage 321 is illustrated.

Referring to FIG. 3, the first stage 321 may include a first driver 3211, a second driver 3212, and a third driver 3213.

The first driver 3211 may generate the first output signal 0S1 using the clock signals CLK1 and CLK2 and the first start signal SP1.

The second driver 3212 may generate the second output signal 0S2 using the clock signals CLK1 and CLK2 and the second start signal SP2. The second driver 3212 may have the same circuit as the first driver 3211.

The third driver 3213 may generate the emission control signal E1 using the first output signal OS1 and the second output signal 0S2. Transistors included in the first to third drivers 3211 to 3213 may be the same conduction type as transistors included in the pixel 50, for example, a PMOS type. In this case, the first to third drivers 3211 to 3213 may be formed on the panel so that manufacturing cost may be saved.

Figure 4:
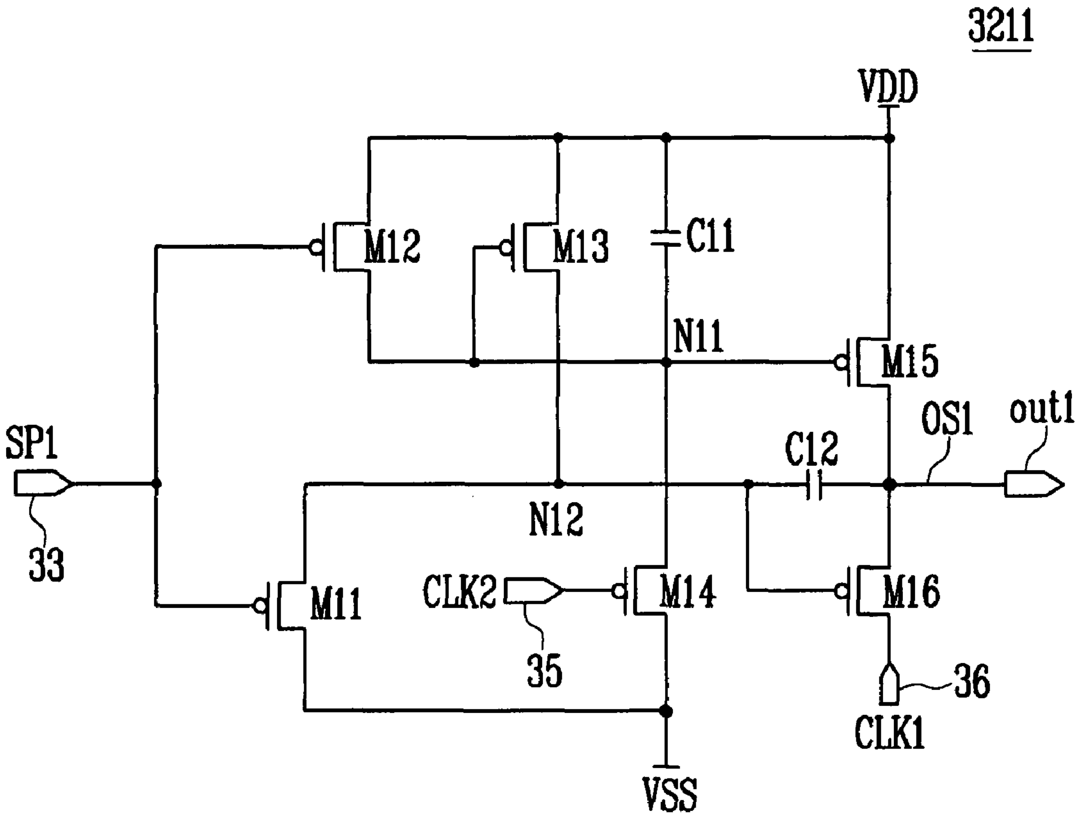
FIG. 4 illustrates a schematic circuit diagram of the first driver illustrated in FIG. 3.

FIG. 4 illustrates a schematic circuit diagram of the first driver illustrated in FIG. 3.

Referring to FIG. 4, the first driver 3211 may output a voltage (that is, the low voltage) of a first power source VDD or the first clock signal CLK1 as the first output signal OS1. The first driver 3211 may include six transistors M11 to M16 and two capacitors C11 and C12.

The first power source VDD may be set to have a higher voltage than a second power source VSS. For example, the first power source VDD may be set to have a voltage at which the transistors are turned off. Also, the second power source VSS may be set to have a voltage at which the transistors are turned on.

A first electrode of a fifteenth transistor M15 may be coupled to the first power source VDD. A second electrode of the fifteenth transistor M15 may be coupled to a first output terminal out1. A gate electrode of the fifteenth transistor M15 may be coupled to an eleventh node N11. The fifteenth transistor M15 may be turned on or off by the voltage of the eleventh node N11.

A first electrode of a sixteenth transistor M16 may be coupled to the first output terminal out1. A second electrode of the sixteenth transistor M16 may be coupled to a third input terminal 36. A gate electrode of the sixteenth transistor M16 may be coupled to a twelfth node N12. The sixteenth transistor M16 may be turned on or off by a voltage of the twelfth node N12. The third input terminal 36 may receive the first clock signal CLK1.

A first electrode of a fourteenth transistor M14 may be coupled to the eleventh node N11. A second electrode of a fourteenth transistor M14 may be coupled to a second power source VSS. A gate electrode of the fourteenth transistor M14 may be coupled to a second input terminal 35. The fourteenth transistor M14 may be turned on or off according to a voltage supplied to the second input terminal 35. The second input terminal 35 may receive the second clock signal CLK2.

A first electrode of a thirteenth transistor M13 may be coupled to the first power source VDD. A second electrode of the thirteenth transistor M13 may be coupled to the twelfth node N12. A gate electrode of the thirteenth transistor M13 may be coupled to the eleventh node N11. The thirteenth transistor M13 may be turned on or off according to the voltage of the eleventh node N11.

A first electrode of a twelfth transistor M12 may be coupled to the first power source VDD. A second electrode of the twelfth transistor M12 may be coupled to the eleventh node N11. A gate electrode of the twelfth transistor M12 may be coupled to a first input terminal 33. The twelfth transistor M12 may be turned on or off according to the voltage supplied to the first input terminal 33. The first input terminal 33 may receive the first start signal SP1.

A first electrode of an eleventh transistor M11 may be coupled to the twelfth node N12. A second electrode of the eleventh transistor M11 may be coupled to the second power source VSS. A gate electrode of the eleventh transistor M11 may be coupled to the first input terminal 33. The eleventh transistor M11 may be turned on or off according to the voltage supplied to the first input terminal 33.

An eleventh capacitor C11 may be coupled between the gate electrode of the fifteenth transistor M15 and the first power source VDD. The eleventh capacitor C11 may charge a voltage corresponding to turning on or off of the fifteenth transistor M15. For example, when the fifteenth transistor M15 is turned on, the eleventh capacitor C11 may charge a voltage at which the fifteenth transistor M15 may be turned on. When the fifteenth transistor M15 is turned off, the eleventh capacitor C11 may charge a voltage at which the fifteenth transistor M15 is turned off.

The twelfth capacitor C12 may be coupled between the gate electrode of the sixteenth transistor M16 and the first output terminal out1. The twelfth capacitor C12 may charge a voltage corresponding to turning on or off of the sixteenth transistor M16.

The second driver 3212 may have the same circuit as the first driver 3211 except that the second driver 3212 receives the second start signal SP2 from a first input terminal 33' of the second driver 3212. Therefore, detailed description of the circuit of the second driver 3212 is omitted here.

Figure 5:
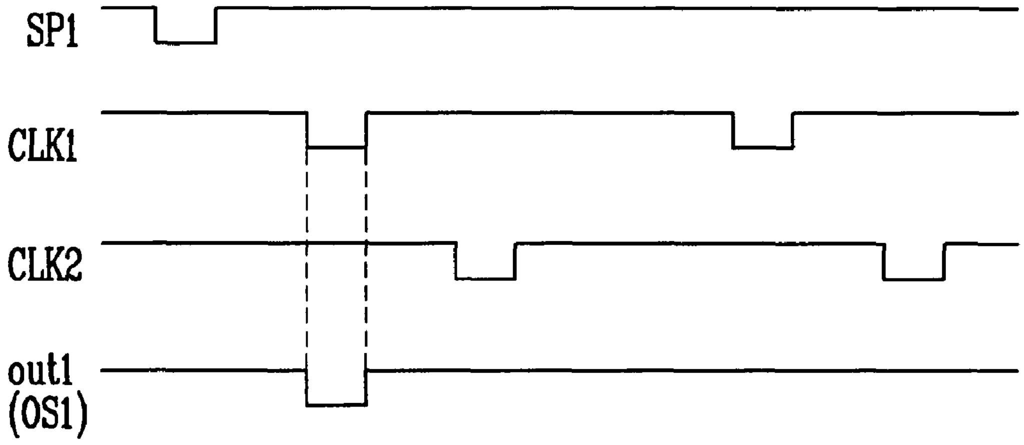
FIG. 5 illustrates a waveform diagram of the operation processes of the first driver illustrated in FIG. 4.

FIG. 5 illustrates a waveform diagram of the operation processes of the first driver illustrated in FIG. 4.

The operation processes are described in detail with reference to FIGS. 4 and 5. First, the first start signal SP1 may be supplied to turn on the eleventh transistor M11 and the twelfth transistor M12.

When the eleventh transistor M11 is turned on, the second power source VSS may be supplied to the twelfth node N12. When the second power source VSS is supplied to the twelfth node N12, the sixteenth transistor M16 may be turned on. When the sixteenth transistor M16 is turned on, the third input terminal 36 may be coupled to the first output terminal out1. The voltage corresponding to turning on of the sixteenth transistor M16 may be charged to the twelfth capacitor C12.

When the twelfth transistor M12 is turned on, the first power source VDD may be supplied to the eleventh node N11. When the first power source VDD is supplied to the eleventh node N11, the thirteenth transistor M13 and the fifteenth transistor M15 may be turned off.

Then, supply of the first start signal SP1 may be stopped. When supply of the first start signal SP1 is stopped, the eleventh transistor M11 and the twelfth transistor M12 may be turned off. At this time, the sixteenth transistor M16 may be continuously turned on by the voltage charged in the twelfth capacitor C12. While the sixteenth transistor M16 is continuously turned on, the first clock signal CLK1, which is a low voltage, may be supplied to the first output terminal out1. Then, the low voltage may be output to the first output terminal out1.

After the first clock signal CLK1 is supplied, the second clock signal CLK2 may be supplied. When the second clock signal CLK2 is supplied, the fourteenth transistor M14 may be turned on. When the fourteenth transistor M14 is turned on, the second power source VSS may be supplied to the eleventh node N11. When the second power source VSS is supplied to the eleventh node N11, the thirteenth transistor M13 and the fifteenth transistor M15 may be turned on.

When the thirteenth transistor M13 is turned on, the first power source VDD may be supplied to the twelfth node N12. When the first power source VDD is supplied to the twelfth node N12, the sixteenth transistor M16 may be turned off. When the fifteenth transistor M15 is turned on, the first power source VDD may be supplied to the first output terminal out1. At this time, the eleventh capacitor C11 may charge voltage corresponding to turning on of the fifteenth transistor M15. In this case, the fifteenth transistor M15 may supply the voltage of the first power source VDD to the first output terminal out1 before the twelfth transistor M12 is turned on by the next first start signal SP1.

As described above, the first driver 3211 may supply the next first clock signal CLK1, which is the low voltage, to the first output terminal out1 after the first start signal SP1 is supplied. The second driver 3212 may supply the next first clock signal CLK1 to a second output terminal out2 when the second start signal SP2 is supplied. Therefore, an interval between the first output signal OS1 from the first driver 3211 and the second output signal 0S2 from the second driver 3212 may correspond to an interval between the first start signal SP1 and the second start signal SP2.

When the first output signal 051 is output to the first output terminal out 1, the voltage corresponding to the first clock signal CLK1 may be applied to the first electrode of the eleventh transistor M11, and the voltage corresponding to the second power source VSS may be applied to the second electrode of the eleventh transistor M11. That is, since a negative polar voltage may be applied to the first electrode and the second electrode of the eleventh transistor M11, driving default caused by a leakage current may be prevented.

The first driver 3211 illustrated in FIG. 4 may be provided in the stage 321 of the emission control line driver 30. However, embodiments are not limited to this embodiment. For example, the first driver 3211 may be provided to constitute stages of the scan driver 10. In this case, the first output signal OS1 output from the first driver 3211 may be used as a scan signal.

The clock signals CLK1 and CLK2 supplied to the input terminals 35 and 36 illustrated in FIG. 4 may be applied to the odd stages 321, 323, . . . . The clock signals CLK1 and CLK2 may be set to partially vary in the even stages 322, 324, . . . .

Figure 6:
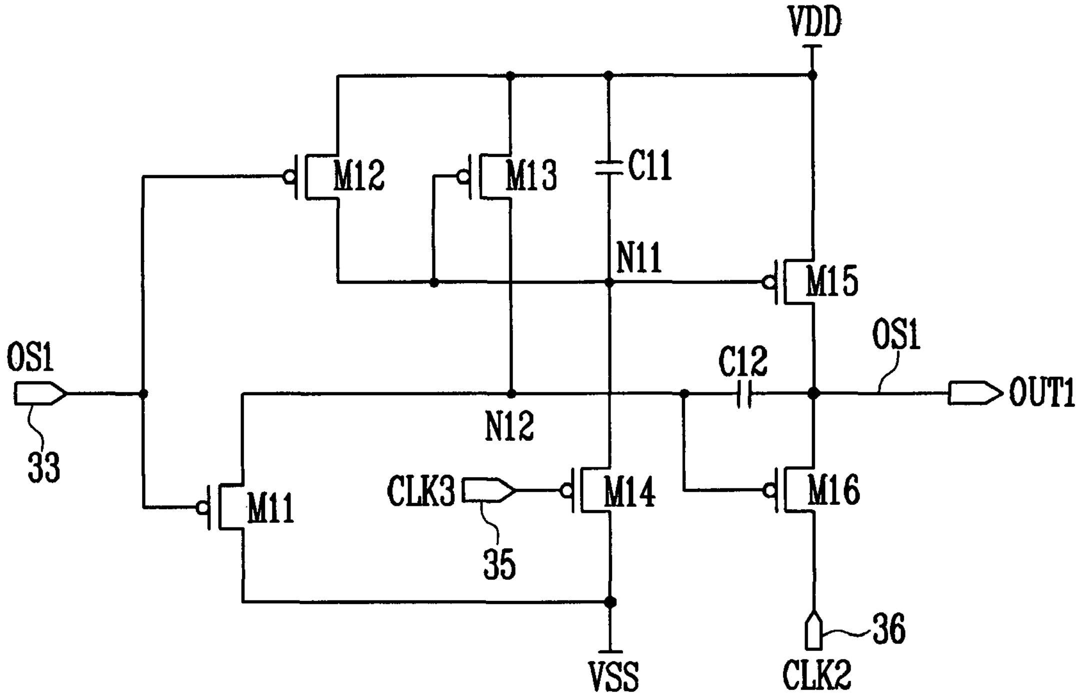
FIG. 6 illustrates a diagram of a first driver included in even stages.

FIG. 6 illustrates a diagram of a first driver included in even stages. In FIG. 6, a second stage 322 is illustrated for the convenience sake.

Referring to FIG. 6, the first driver of the second stage 322 may include the same circuit structure as the first driver included in the odd stages 321, 323, . . . as illustrated in FIG. 4.

The first input terminal 33 may receive the first output signal OS1 output from the first driver of the first stage 321. The second input terminal 35 may receive the third clock signal CLK3. The third input terminal 36 may receive the second clock signal CLK2.

Figure 7:
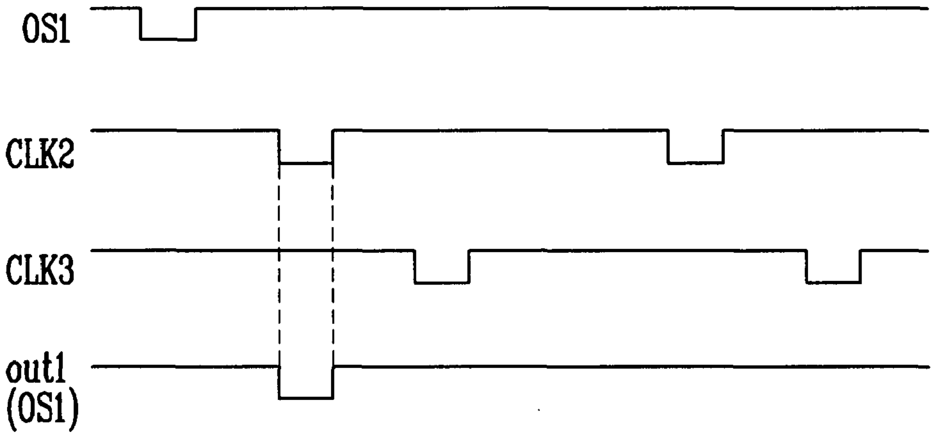
FIG. 7 illustrates a waveform diagram of the operation processes of the first driver illustrated in FIG. 6.

Operation processes will be briefly described with reference to FIG. 7. When the first output signal OS1 is supplied, the eleventh transistor M11 and the twelfth transistor M12 may be turned on. The sixteenth transistor M16 may be turned on by the second voltage VSS applied to the twelfth node N12. When the sixteenth transistor M16 is turned on, the second clock signal CLK2 may be supplied to the first output terminal out1. In this case, the first output terminal out1 may output the low voltage when the second clock signal CLK2 is supplied.

Then, the third clock signal CLK3 may be supplied so that the fourteenth transistor M14 may be turned on. When the fourteenth transistor M14 is turned on, the voltage of the second power source VSS may be supplied to the eleventh node N11 so that the thirteenth transistor M13 and the fifteenth transistor M15 are turned on. When the fifteenth transistor M15 is turned on, the voltage of the first power source VDD may be supplied to the first output terminal out 1. When the thirteenth transistor M13 is turned on, the first power source VDD may be supplied to the second node N12 so that the sixteenth transistor M16 is turned off.

When the fifteenth transistor M15 is turned on, a voltage corresponding to turning on of the fifteenth transistor M15 may be charged in the eleventh capacitor C11. Therefore, the fifteenth transistor M15 may be continuously turned on before the next first output signal OS1 is supplied, and supply the voltage of the first power source VDD to the first output terminal out1.

The first driver of the second stage 322 as described above may supply the next second clock signal CLK2, which is the low voltage, to the first output terminal out1 when the first output signal OS1 is supplied. The second driver of the second stage 322 may supply the next second clock signal CLK2 to the second output terminal out2 of the second stage 322 when the second output signal OS2 is supplied.

The first clock signal CLK1, the second clock signal CLK2, and the third clock signal CLK3 may be sequentially supplied in this order so that the above-described driving processes may be stably performed.

Figure 8A:
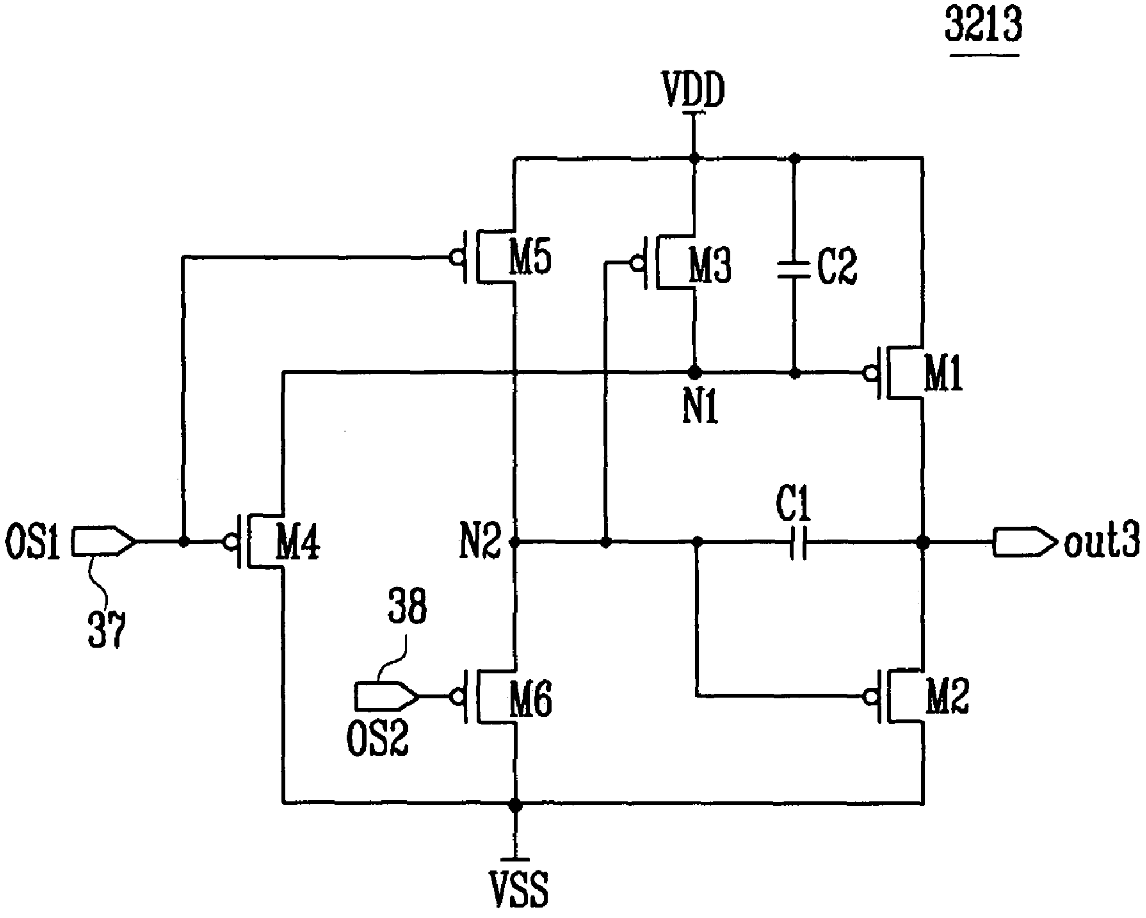
FIG. 8A is a schematic circuit diagram of the third driver illustrated in FIG. 3.

FIG. 8A illustrates a schematic circuit diagram of the third driver illustrated in FIG. 3.

Referring to FIG. 8A, the third driver 3213 may output the first power source VDD or the second power source VSS to a third output terminal out3 to correspond to the first output signal 0S1 and the second output signal 0S2. The third driver 3213 may include six transistors M1 to M6 and two capacitors C1 and C2.

A first electrode of the first transistor M1 may be coupled to the first power source VDD. A second electrode of the first transistor M1 may be coupled to the third output terminal out3. A gate electrode of the first transistor M1 may be coupled to a first node N1. A first transistor M1 may be turned on or off by the voltage of the first node N1.

A first electrode of the second transistor M2 may be coupled to the third output terminal out3. A second electrode of the second transistor M2 may be coupled to the second power source VSS. A gate electrode of the second transistor M2 may be coupled to a second node N2. The second transistor M2 may be turned on or off by a voltage of the second node N2.

A first electrode of the third transistor M3 may be coupled to the first power source VDD. A second electrode of the third transistor M3 may be coupled to the first node N1. A gate electrode of the third transistor M3 may be coupled to the second node N2. The third transistor M3 may be turned on or off by the voltage of the second node N2.

The first capacitor C1 may be coupled between the gate electrode of the second transistor M2 and the third output terminal out3. The first capacitor C1 may charge the voltage corresponding to turning on or off of the second transistor M2. For example, when the second transistor M2 is turned on, the first capacitor C1 may charge the voltage at which the second transistor M2 may be turned on. When the second transistor M2 is turned off, the first capacitor C1 may charge the voltage at which the second transistor M2 is turned off.

The second capacitor C2 may be coupled between the gate electrode of the first transistor M1 and the first power source VDD. The second capacitor C2 may charge the voltage corresponding to turning on or off of the first transistor M1.

A first electrode of the fifth transistor M5 may be coupled to the first power source VDD. A second electrode of the fifth transistor M5 may be coupled to the second node N2. A gate electrode of the fifth transistor M5 may be coupled to a fourth input terminal 37. The fifth transistor M5 may be turned on or off to correspond to the voltage supplied to the fourth input terminal 37. The fourth input terminal 37 may receive the first output signal OS1.

Figure 8B:
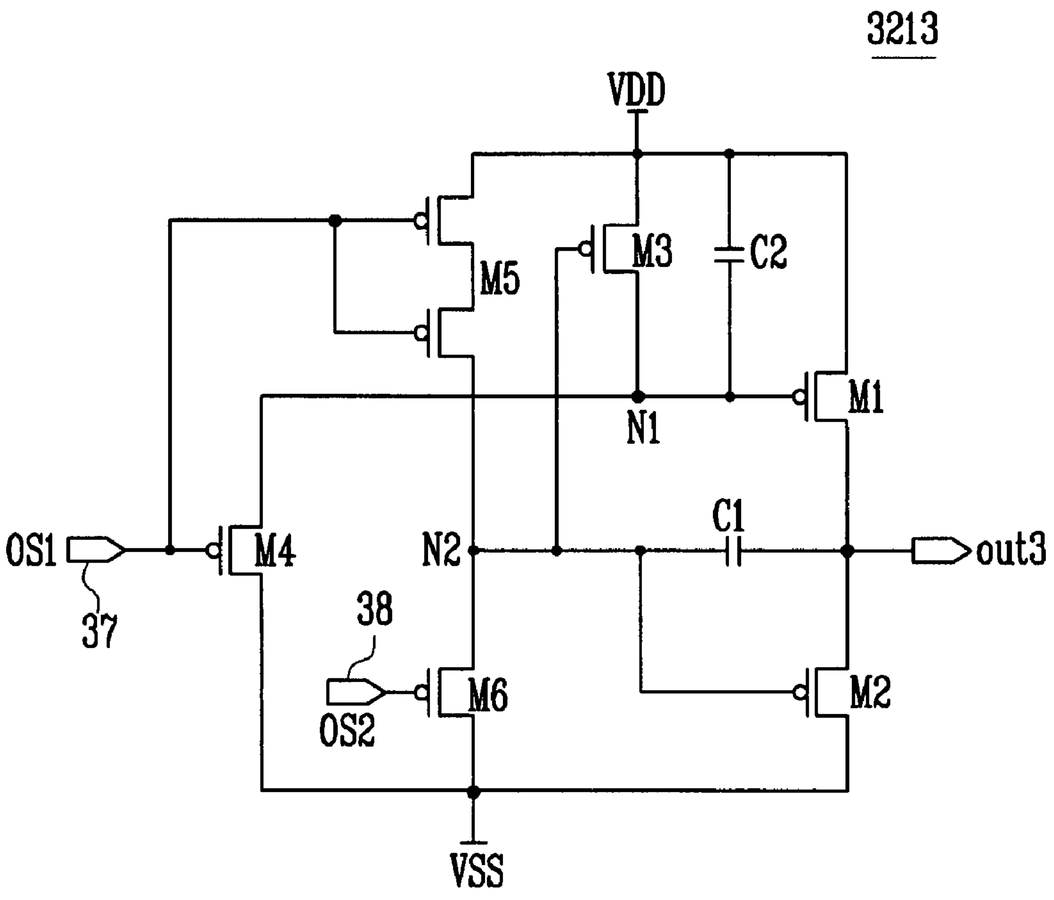
FIG. 8B illustrates a schematic circuit diagram of another embodiment of the third driver illustrated in FIG. 3.

Alternatively, as illustrated in FIG. 8B, the fifth transistor M5 may be substituted by two transistors coupled in series. As a transistor for supplying the voltage of the first power source VDD to the second node N2, the fifth transistor M5 may be replaced with two transistors coupled in series for obtaining driving stability.

A first electrode of the sixth transistor M6 may be coupled to the second node N2. A second electrode of the sixth transistor M6 may be coupled to the second power source VSS. A gate electrode of the sixth transistor M6 may be coupled to a fifth input terminal 38. The sixth transistor M6 may be turned on or off to correspond to a voltage supplied to the fifth input terminal 38. The fifth input terminal 38 may receive the second output signal 052.

A first electrode of the fourth transistor M4 may be coupled to the first node N1. A second electrode of the fourth transistor M4 may be coupled to the second power source VSS. A gate electrode of the fourth transistor M4 may be coupled to the fourth input terminal 37. The fourth transistor M4 may be turned on or off to correspond to a voltage of the fourth input terminal 37.

Figure 9:
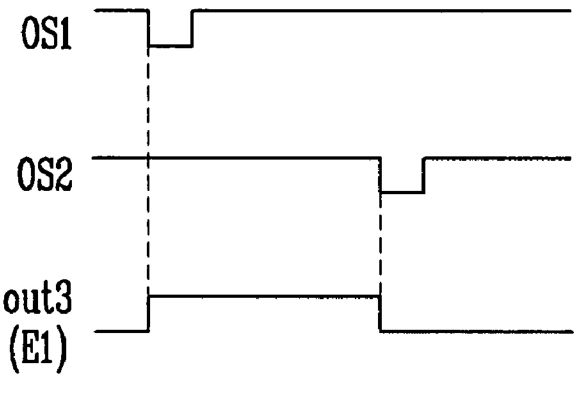
FIG. 9 illustrates a waveform diagram of the operation processes of the third driver illustrated in FIG. 8B.

FIG. 9 illustrates a waveform diagram of the operation processes of the third driver illustrated in FIG. 8.

Referring to FIG. 9, when the first output signal 0S1, which is the low voltage is supplied to the fifth input terminal 37, the fourth transistor M4 and the fifth transistor M5 may be turned on. At this time, since the fifth input terminal 38 may receive a high voltage, the sixth transistor M6 may be turned off.

When the fifth transistor M5 may be turned on, the voltage of the first power source VDD may be supplied to the second node N2. In this case, the second transistor M2 and the third transistor M3 coupled to the second node N2 may be turned off.

When the fourth transistor M4 is turned on, the voltage of the second power source VSS may be supplied to the first node N1. In this case, the first transistor M1 coupled to the first node N1 may be turned on. When the first transistor M1 is turned on, the voltage of the first power source VDD may be supplied to the third output terminal out3. Therefore, the emission control signal may be supplied to the emission control line E1 coupled to the third output terminal out3.

The second capacitor C2 may charge the voltage corresponding to turning on of the first transistor M1. The first capacitor C1 may charge the voltage corresponding to turning off of the second transistor M2. A high voltage may be supplied to the fourth input terminal 37 so that the fourth transistor M4 and the fifth transistor M5 may be turned off. However, while the first transistor M1 may be continuously turned on, the second transistor M2 may be continuously turned off to supply the voltage of the first power source VDD to the third output terminal out3.

Then, the second output signal 0S2 may be supplied to the fifth input terminal 38 so that the sixth transistor M6 may be turned on. While the second output signal 0S2 is supplied, a high voltage may be supplied to the fourth input terminal 37 so that the fourth transistor M4 and the fifth transistor M5 may be turned off.

When the sixth transistor M6 is turned on, the voltage of the second power source VSS may be supplied to the second node N2. In this case, the third transistor M3 and the second transistor M2 coupled to the second node N2 may be turned on.

When the third transistor M3 is turned on, the voltage of the first power source VDD may be supplied to the first node N1. In this case, the first transistor M1 coupled to the first node N1 may be turned off. When the second transistor M2 is turned on, the voltage of the second power source VSS may be supplied to the third output terminal out3. Therefore, the supply of the emission control signal to the emission control line E1 coupled to the third output terminal out3 may be stopped.

The second capacitor C2 may charge the voltage corresponding to turning off of the first transistor M1. The first capacitor C1 may charge the voltage corresponding to turning on of the second transistor M2. Therefore, the voltage of the third output terminal out3 may be stably maintained as the voltage of the second power source VSS before the first output signal OS1 is supplied to the first input terminal 37.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A driver, comprising:

odd-numbered stages configured to be directly driven by exactly two clock signals, wherein the two clock signals include a first clock signal and a second clock signal; and even-numbered stages configured to be directly driven by exactly two clock signals, wherein the two clock signals include the second clock signal and a third clock signal, wherein each of the odd-numbered and even-numbered stages includes a first driver, a second driver, and a third driver, and is coupled to a corresponding emission control line, wherein the first driver of a first stage is configured to receive a first start pulse and output a first output signal of the first stage, the second driver of the first stage is configured to receive a second start pulse and output a second output signal of the second stage, and the third driver of the first stage is configured to receive the first output signal of the first stage and the second output signal of the second stage, and output an emission control signal to be transmitted to an emission control line coupled to the first stage, and wherein the first driver of each stage except the first stage is configured to receive a first output signal of a previous stage and output a first output signal of each stage, the second driver of each stage except the first stage is configured to receive a second output signal of the previous stage and output a second output signal of each stage, and the third driver of each stage except the first stage is configured to receive the first output signal and the second output signal and output an emission control signal to be transmitted to a emission control line coupled to each stage.

2. The driver as claimed in claim 1, wherein the first clock signal, the second clock signal, and the third clock signal are sequentially supplied in order thereof.

3. The driver as claimed in claim 2, wherein the first clock signal, the second clock signal, and the third clock signal are supplied in the same period.

4. The driver as claimed in claim 1, wherein a width of the emission control signals is determined by a period between the first start pulse and the second start pulse.

5. The driver as claimed in claim 1, wherein each of the first output signals is supplied at a point of time in synchronization with the first clock signal, and wherein the second clock signal is supplied after the point of time in synchronization with the first clock signal.

6. The driver as claimed in claim 1, wherein each of the first driver and the second driver comprises a twelfth transistor having a second gate electrode coupled to a first input terminal, a third electrode coupled to a first power source, and a fourth electrode coupled to an eleventh node, the twelfth transistor controlling a voltage of the eleventh node so as to correspond to a voltage applied to the first input terminal, an eleventh transistor having a first gate electrode coupled to the first input terminal, a first electrode coupled to a second power source, and a second electrode coupled to a twelfth node, the eleventh transistor controlling a voltage of the twelfth node so as to correspond to the voltage applied to the first input terminal, a thirteenth transistor coupled between the first power source and the twelfth node and controlled by the voltage of the eleventh node, a fourteenth transistor coupled between the eleventh node and the second power source and controlled by a voltage of a second input terminal, a fifteenth transistor coupled between the first power source and an output terminal and controlled by the voltage of the eleventh node, a sixteenth transistor coupled between the output terminal and a third input terminal and controlled by the voltage of the twelfth node, an eleventh capacitor coupled between a gate electrode of the fifteenth transistor and the first power source, and a twelfth capacitor coupled between a gate electrode of the sixteenth transistor and the output terminal.

7. The driver as claimed in claim 6, wherein the first power source is set to have a higher voltage than the second power source.

8. The driver as claimed in claim 6, wherein the first start pulse is supplied to the first input terminal of the first driver in the first stage, and the first output signal of the previous stage is supplied to the first input terminal of the first driver in the each stage except the first stage, and wherein the second start pulse is supplied to the first input terminal of the second driver in the first stage, and a second output signal of a previous stage is supplied to the first input terminal of the second driver in each stage except the first stage.

9. The driver as claimed in claim 6, wherein the second clock signal is supplied to the second input terminals of the first driver and the second driver included in each of the odd-numbered stages, and wherein the first clock signal is supplied to the third input terminals of the first driver and the second driver included in each of the odd-numbered stages.

10. The driver as claimed in claim 6, wherein the third clock signal is supplied to the second input terminal of the first driver and the second driver included in each of the even-numbered stages, and wherein the second clock signal is supplied to the third input terminal of the first driver and the second driver included in each of the even-numbered stages.

11. The driver as claimed in claim 6, wherein the first driver outputs the first output signal to the output terminal of the first driver, and wherein the second driver outputs the second output signal to the output terminal of the second driver.

12. The driver as claimed in claim 1, wherein the third driver outputs the emission control signal from a first point of time when the first output signal has a low voltage to a second point of time when the second output signal has a low voltage.

13. The driver as claimed in claim 12, wherein the third driver comprises a fifth transistor having a third gate electrode coupled to a fourth input terminal and a fifth electrode coupled to the first power source, the fifth transistor controlling a voltage of a second node so as to correspond to a voltage applied to the fourth input terminal, a fourth transistor having a fourth gate electrode coupled to the fourth input terminal and a sixth electrode coupled to the second power source, the fourth transistor controlling a voltage of a first node so as to correspond to the voltage applied to the fourth input terminal, a sixth transistor coupled between the second node and the second power source and controlled by a voltage of a fifth input terminal, a first transistor coupled between the first power source and an output terminal and controlled by the voltage of the first node, a second transistor coupled between the output terminal and the second power source and controlled by the voltage of the second node, a third transistor coupled between the first power source and the first node and controlled by the voltage of the second node, a first capacitor coupled between a gate electrode of the second transistor and the output terminal, and a second capacitor coupled between a gate electrode of the first transistor and the first power source.

14. The driver as claimed in claim 13, wherein the fourth input terminal receives the first output signal, and wherein the fifth input terminal receives the second output signal.

15. The driver as claimed in claim 13, wherein the output terminal is coupled to a corresponding emission control line.

16. The driver as claimed in claim 13, wherein the fifth transistor is substituted by two or more transistors coupled in series.

17. A driver, comprising stages coupled to signal lines, wherein each of the stages comprises:

a twelfth transistor having a second gate electrode coupled to a first input terminal, a third electrode coupled to a first power source, and a fourth electrode coupled to an eleventh node, the twelfth transistor controlling a voltage of the eleventh node so as to correspond to a voltage applied to the first input terminal;

an eleventh transistor having a first gate electrode coupled to the first input terminal, a first electrode coupled to a second power source, and a second electrode coupled to a twelfth node, the eleventh transistor controlling a voltage of the twelfth node coupled to correspond to the voltage applied to the first input terminal;

a thirteenth transistor coupled between the first power source and the twelfth node and controlled by a voltage of the eleventh node;

a fourteenth transistor coupled between the eleventh node and the second power source and controlled by a voltage of a second input terminal;

a fifteenth transistor coupled between the first power source and an output terminal and controlled by the voltage of the eleventh node;

a sixteenth transistor coupled between the output terminal and a third input terminal and controlled by the voltage of the twelfth node;

an eleventh capacitor coupled between a gate electrode of the fifteenth transistor and the first power source; and a twelfth capacitor coupled between a gate electrode of the sixteenth transistor and the output terminal.

18. The driver as claimed in claim 17, wherein the first power source is set to have a higher voltage than the second power source.

19. An organic light emitting diode display, comprising:

a scan driver configured to sequentially supply scan signals to scan lines;

a data driver configured to supply data signals to data lines in synchronization with the scan signals;

pixels positioned at intersections of the scan lines and the data lines; and the driver as claimed in claim 1, the driver configured to transmit the emission control signals to emission control lines running in parallel with the scan lines.

* * * * *